United States Patent [19]

Mayfield

[11] Patent Number: 4,514,686
[45] Date of Patent: Apr. 30, 1985

[54] POWER TRANSDUCER

[75] Inventor: Glenn A. Mayfield, West Lafayette, Ind.

[73] Assignee: Duncan Electric Company, Inc., Lafayette, Ind.

[21] Appl. No.: 297,559

[22] Filed: Aug. 31, 1981

[51] Int. Cl.³ .......................................... G01R 21/06
[52] U.S. Cl. .................................... 324/142; 328/160
[58] Field of Search ........................ 324/142; 328/160; 364/483, 842

[56] References Cited

U.S. PATENT DOCUMENTS

| | | | |
|---|---|---|---|
| 3,712,977 | 1/1973 | Rice, Jr. | 364/842 |
| 3,976,942 | 8/1976 | Mayfield | 324/142 |
| 4,027,241 | 5/1977 | Jauch | 324/142 |
| 4,055,804 | 10/1977 | Mayfield | 324/142 |
| 4,182,983 | 1/1980 | Heinrich et al. | 324/142 |

Primary Examiner—Stewart J. Levy
Attorney, Agent, or Firm—John R. Nesbitt

[57] ABSTRACT

A Power Transducer is disclosed, such as a watt-watt-hour Transducer, having a dual multiplier circuit receiving inputs from a power source to be monitored and a triangle wave generator. The circuit includes first and second transformers which separately receive voltage and current inputs representative of the power line to be monitored. The first transformer provides dual outputs of opposite polarity which are isolated and scaled replicas of the input voltage. The dual outputs are separately channeled through half-wave multiplier paths, to a comparator in each path, which comparators receive the input from the triangle wave generator to produce a pulse modulated output for control of a switch in each path, which switches also receive the current signal from the second transformer. The outputs from the switches have pulse heights proportional to the instantaneous value of the current and pulse widths proportional to the incoming voltage with the integral being equal to the product of the voltage and current. The combined switch outputs are filtered to remove the chopping frequency and then coupled to a load.

18 Claims, 17 Drawing Figures

POWER TRANSDUCER

FIELD OF THE INVENTION

This invention relates to power transducers and, more particularly, relates to dual multiplier power transducers.

BACKGROUND OF THE INVENTION

Power transducers, such as watt-watthour transducers, are known, and such devices are known to include, for example, voltage and current input scaling means for providing signals proportional to the voltage and current on a power line to be monitored. The signals thus generated are then multiplied by a multiplier circuit to provide an output signal having a value substantially proportional to the power, or rate of energy flow, of the monitored power line.

It has also been heretofore suggested that the multiplier circuit include a pulse width modulating circuit (see, for example, U.S. Pat. No. 3,794,917) wherein one of the input signals (or a signal proportional thereto) is modulated by the other input signal (or a signal proportional thereto) to produce a series of pulses having heights proportional to the instantaneous value of either the current or voltage in the power line and having pulse widths proportional to the instantaneous value of the other. Since the average value of these series of pulses is proportional to the instantaneous power of the power line, filtering and amplification of the modulation output provides an output signal indicative of instantaneous power and integration with respect to time of the modulated output provides an output comparable to total watt hours of energy through the power line for a particular time interval.

Watt/Watthour transducers have also been heretofore suggested to include a comparator receiving a signal from the power line proportional to voltage and the output from a triangle wave generator to produce a pulse width modulated output signal to modulate the signal from the power line proportional to current (see, for example, U.S. Pat. Nos. 3,976,942 and 4,055,804).

SUMMARY OF THE INVENTION

This invention provides an improved power transducer having a dual multiplier circuit receiving an input proportional to voltage on a power line and the output from a triangle wave generator to produce dual half-wave modulated signals which control switching of an input proportional to current on a power line to thereby provide an accurate and stable output indicative of power flowing through the monitored power line, as well as an improved triangle wave generator and filtering circuit utilized in such a power transducer.

It is therefore an object of this invention to provide an improved power transducer.

It is another object of this invention to provide an improved power transducer having a dual multiplier circuit.

It is still another object of this invention to provide an improved power transducer having a dual multiplier circuit receiving a signal proportional to the voltage on a monitored power line and the output from a triangle wave generator to provide dual modulated signals for controlling switching of an input proportional to current on the monitered power line.

It is still another object of this invention to provide an improved power transducer providing an accurate and stable output indicative of power flowing through a power line.

It is still another object of this invention to provide an improved power transducer having a dual multipling circuit to provide substantially reduced noise and error because of beat frequencies between modulation frequencies and power frequencies (and harmonics).

It is yet another object of this invention to provide an improved power transducer having a dual multiplier circuit to substantially reduce errors caused by voltage offsets of the operational amplifiers used within the realization, permitting lower cost and CMOS operational amplifiers to be used.

It is still another object of this invention to provide an improved power transducer having a dual multiplier circuit to reduce substantially sensitivity to common mode rejection ratio of the operational amplifiers and comparators utilized.

It is yet another object of this invention to provide an improved power transducer having a dual multiplier circuit to permit the modulating frequency to be lower than is commonly now used with respect to the power line frequency being measured, therefore reducing error.

It is still another object of this invention to provide an improved power transducer having a dual multiplier circuit to substantially reduce the zero errors inherit in the modulating circuits by virtue of having two of them with inherit errors tending to cancel.

It is still another object of this invention to provide an improved power transducer having a dual multiplier circuit to substantially reduce the actual amount of current flowing through the modulating circuits, particularly at low input voltages, therefore attaining percent of error rating accuracy on the voltage axis as has long been obtained on the current axis.

It is still another object of this invention to provide an improved power transducer having a dual multiplier circuit to reduce errors resulting from AC coupling from the primary side to the secondary side of the isolation means utilized within the voltage input circuit.

It is still another object of this invention to provide an improved power transducer having a dual multiplier circuit to reduce gain error caused by variable delays in the comparators used in the pulse width modulator.

It is yet another object of this invention to provide an improved power transducer having a dual multiplier circuit to sufficiently and substantially decrease the absolute errors (before calibration) of the pulse width modulation and multiplexing circuits so as to reduce or totally eliminate the need for a calibration adjustment on the transducers and meters incorporating this invention.

It is still another object of this invention to provide an improved power transducer having a dual multiplier circuit to substantially lower the amplitude and noise of the frequency of a chopped wave form resulting from pulse width modulation multiplication for increased accuracy.

It is still another object of this invention to provide an improved triangle wave generator.

It is still another object of this invention to provide an improved triangle wave generator to achieve lower power consumption and therefore lower power supply costs and heat dissipations.

It is yet another object of this invention to provide an improved triangle wave generator having a higher degree of accuracy.

It is another object of this invention to provide an improved filtering circuit.

It is still another object of this invention to provide an improved filtering circuit that is a multi-pole active filter.

With these and other objects in view, which will become apparent to one skilled in the art as the description proceeds, this invention resides in the novel construction, combination, and arrangement of parts substantially as is hereinafter desribed, and more particularly defined by the appended claims, it being understood that such changes in the precise embodiment of the herein disclosed invention are meant to be included within the scope of the claims.

BRIEF DESCRIPTION OF THE DRAWINGS

The accompanying drawings illustrate a complete embodiment of this invention according to the best mode so far devised for the practical application of the principles thereof, and in which.

DESCRIPTION OF THE INVENTION

Figure 1:
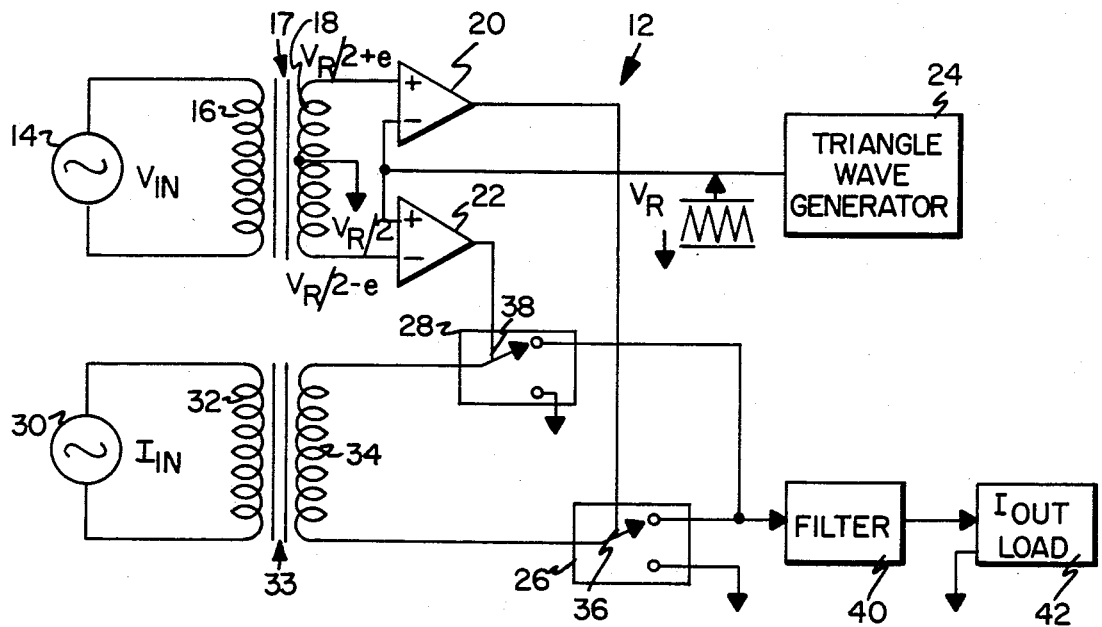
FIG. 1 is a block and schematic diagram of the improved power transducer of this invention.

Power transducer 12 may be a watt, Q or VAR transducer or a watthour, Q hour, or VAR hour meter, with transducer 12, as shown in FIG. 1, being a watt/transducer.

As shown, a voltage source 14 (typically from a power line to be monitored) is connected with the primary winding 16 of transformer 17, which transformer has a center tapped secondary winding 18. Transformer 17 creates an isolated and scaled replica of the input (and could be replaced by other means for creating such a replica) and is preferably a low loss ferrite core having wound thereon a primary winding of 12,000 turns and a secondary winding of 169 turns at each side of the center tap. The center tap of the secondary winding is preferably connected to a voltage equal to one half the voltage reference over two ($V_r/2$) to preclude the necessity of having two voltage references.

Figure 7:
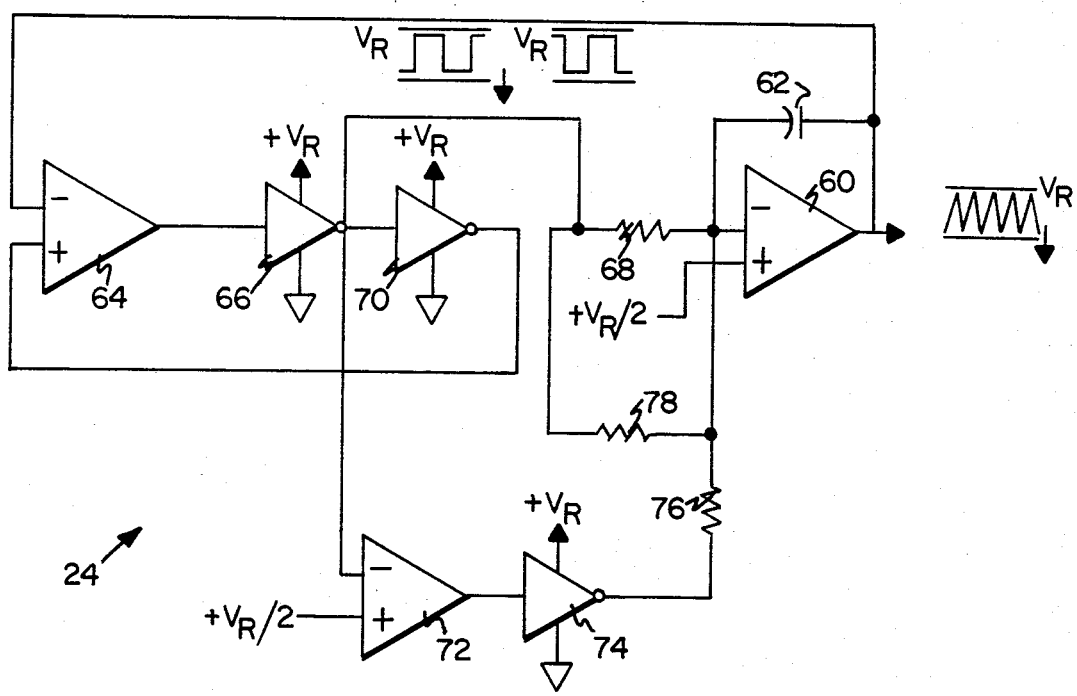
FIG. 7 is a block and schematic diagram of the triangle wave generator utilized in this invention.
Figure 9:
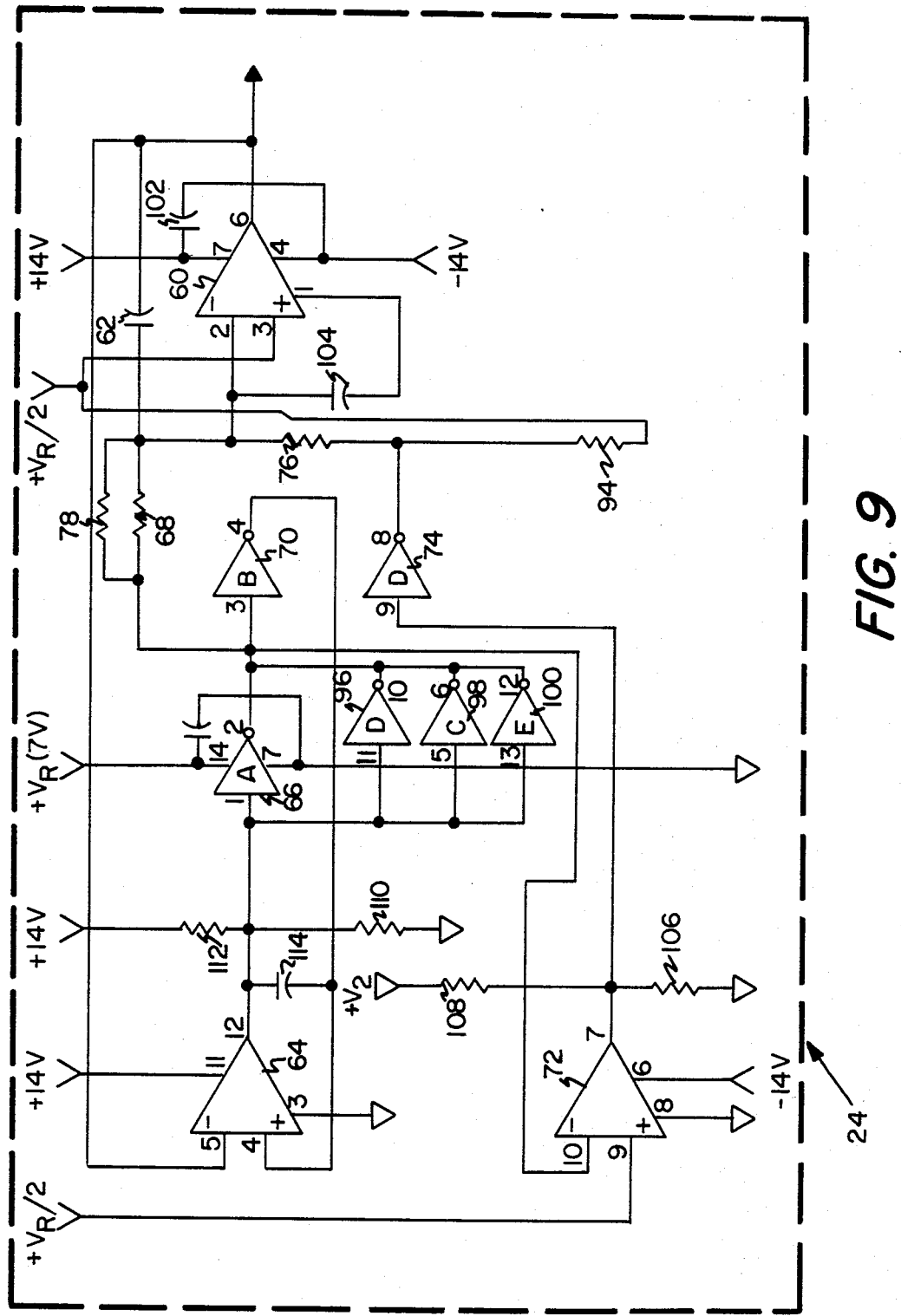
FIG. 9 is a block and schematic diagram of the triangle wave generator shown in FIG. 7.

One side of secondary winding 18 provides a signal $V_r/2+E$ to the positive input of comparator 20, while on the other side of secondary winding 18 provides a signal $V_r/2-E$ to the negative input of comparator 22. The negative input of comparator 20 and the positive input of comparator 22 receive a triangle wave input from triangle wave generator 24. The triangle wave has very high accuracy and linearity and has an amplitude that is both known and stable. While a conventional triangle wave generator having such capability may be utilized, generator 24 is preferably an improved triangle wave generator as shown in FIGS. 7 and 9 and described hereinafter. In the example shown, generator 24 oscillates between ground and a positive voltage reference.

Since the incoming signal from transformer 17 is coupled to comparators 20 and 22 along with the triangle wave from triangle wave generator 24, each comparator is caused to produce a pulse width modulated output with each output being channeled in separate paths, one of which is through comparator 20 to switch 26, and the other of which is through comparator 22 to switch 28, to control operation of the switches. Switches 26 and 28 are preferably solid-state switches providing a single pole-double throw capability.

A current source 30 is connected to primary winding 32 of transformer 33 having a secondary winding 34. Transformer 33 provides current isolation (and could be replaced by other current isolation means). Secondary winding 34 (which is a floating current secondary) has one side connected to the common terminal 36 of switch 26, while the other side is connected to the common terminal 38 of switch 28.

The dual pulse width modulated signals from comparators 20 and 22 thus control and determine the current pulses passed through switches 26 and 28 (i.e. the current pulses are controlled from the voltage axis) such that the output current pulses from the switches have heights proportional to the instantaneous value of the current and widths proportional to the incoming voltage. The integral of the pulses is, therefore, equal to the product of the voltage and current.

As indicated in FIG. 1, the current pulses from switches 26 and 28 are combined and coupled through filter 40 (for removal of the chopping frequency) to a load 42, which in meter applications, for example, would consist of a current - to - pulse converter and a register.

As can be appreciated from the foregoing, two separate multipliers having separate paths are utilized in this invention. One path, or channel, includes comparator 20 and switch, or multiplexer, 26 in conjunction with triangle wave generator 24, to comprise a first complete half-wave multiplier, while comparator 22 and switch, or multiplexer, 28, in conjunction with triangle wave generator 24, comprise a second complete half-wave multiplier. The combined outputs from the multipliers (with proper phasing of the comparator and multiplexer switches) is a dual half-wave multiplier (rather than a full-wave multiplier).

A primary advantage of full-wave multipliers is that the theoretical output is achieved, while half-wave multipliers produce only half of the current that would be available if there were an ideal multiplier present. Half-wave multipliers also normally have a very substantial fundamental frequency output on their output side which is difficult to filter out, whereas a true full-wave multiplier has only the 2F frequency (i.e. twice the fundamental) present. Dual half-wave multipliers retain this advantage in that there is only the 2F component present.

Multiplexers 26 and 28 have charge injection errors when they switch. Because of the gate drive, there is a small amount of charge which is injected into the associated channel when the units are switched on and removed out of the channels when the units are switched off. These signals never cancel exactly between their switching on and switching off and there is a net gain or loss in charge depending upon the geometry of the devices.

If multiplexers 26 and 28 are made exactly the same and the roles of the two multiplexers reversed in one or the other, the net charge error in one would be opposite the net charge error in the other and substantially of the same magnitude when they are both on the same substrate and manufactured at the same time with the same masks. Therefore, there is a cancellation effect on zero errors observable at the output of the two multiplexers.

The state-of-the-art on these zero errors has been on the order of 3 to 10 nanoamperes which, with typical ranges, represent 3 to 10 parts per million error. Errors below 0.1 nanoamperes without adjustments have been realized readily with the circuit of this invention as shown in FIG. 1. This represents more than an order of magnitude improvement. This order of magnitude improvement essentially represents that the differences between the two charge errors are more than ten times lower than the magnitudes of the two charge errors.

Figure 2:
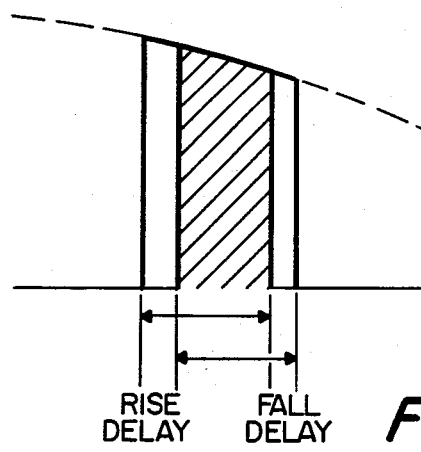
FIG. 2 are wave forms illustrating a typical and theoretical current pulse produced at the output of the modulator.

A second source of error in such circuits is the delay in the rise and fall of the comparators 20 and 22 as they are switched. FIG. 2 illustrates a typical pulse of current coming out of multiplexers 26 and 28. The solid line represents the theoretical pulse shape and timing based upon the delay within the comparator. The dotted line represents the actual (exaggerated) rise and fall time due to the delays within the comparator which has a different speed for rise of the output and fall of the output.

There is inherently a degree of cancellation of this error because of the AC nature of the signal being compared and the AC input signal. However, the presence of two comparators achieves a higher degree of cancellation. If the rise time is slower than the fall time, the rise delay will be longer than the fall delay and there is net reduction of width of the resultant pulse. However, one comparator is operating in opposite polarity with respect to the other, so that while one of them tends to narrow the pulses, the other one tends to widen them. Since they are typically of identical design and manufactured at the same time on the same integrated circuit, a high degree of similarity can be expected in their operating performance and a substantial cancellation of this effect in the circuit can, therefore, be expected.

Another source of error is the common mode rejection ratio of comparators 20 and 22. A typical design, be it half-wave or full-wave utilizes only a single comparator. When there are common mode errors present, the effect may be such that the effective gain of the circuit may be either increased or decreased.

The common mode error is such that the effective offset voltage of the comparator is different at different input levels when a comparison is being made. For example, if the offset voltage of the comparator is zero volts at zero potential but is 10 millivolts higher than the minus input for the switch to occur at the one volt level, the input signal must therefore, reach 1.01 volts to compare successfully with the triangle wave when it is at 1.00 volts. This means that the circuit senses 1.00 volts in the presence of 1.01 for a 1% loss in gain for a 1% common mode error that is positive.

In a typical application, the two comparators 20 and 22 are made with identical mask designs on the same piece of silicon at the same time. Therefore, if there are mask misalignments or gradients in silicon characteristics, the two would be expected to have very similar common mode errors as a result, in which case the common mode error would be positive for both comparators.

In the circuit of this invention, the positive input of comparator 20 is connected to transformer secondary input 18 and the negative input of comparator 22 is connected to transformer secondary input 18. Therefore, the multiplier path comprising comparator 20 and multiplexer 26 with a hypothetical +1% common mode error would have a gain of 1.01 and the multiplier path comprising comparator 22 and switch 28 would have a gain of 0.99. The result is that the average gain of the two is 1.000, or a cancellation of the errors. In reality, total cancellation will not exactly occur, but a substantial improvement can be realized with even use of commercially available multiple comparators such as LM339, and this improvement can be enhanced even further with custom monolithic integrated circuits which enhance this desired effect.

Another source of error within this type of circuit, particularly when transformers are used for the scaling and isolation means of the potential input, is that there is capacitive coupling to the secondary winding from the primary winding. This capacitive coupling injects currents which are dropped across the impedance of the primary winding and results in an added error voltage in the pulse width modulation circuit. This error voltage is then multiplied times the current signal and results in a net dc error at the output.

Figure 3:
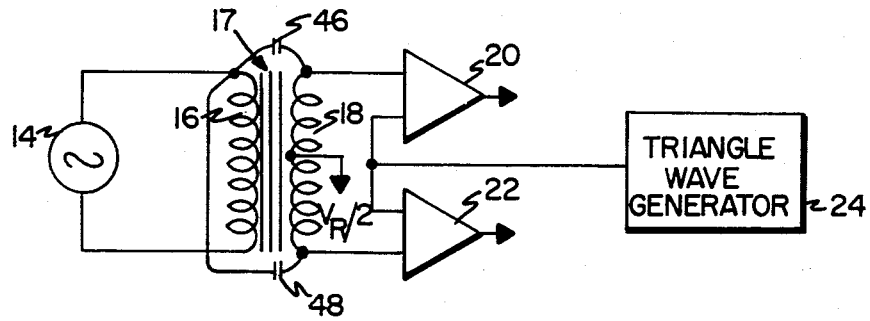
FIG. 3 is a block and schematic diagram particularly illustrating input isolation of the transducer of this invention.

As shown in FIG. 3, the input isolation means includes capacitors 46 and 48. Because of the manner in which transformers are normally wound, capacitance couplings in the secondary windings are primarily coupled to only a small section of the primary winding (normally the first layer wound or the layer wound that is closest to or adjacent to the secondary). This injection current would therefore be substantially equal in both of the secondary windings of transformer 17. However, the result is that since the error (injected current) is substantially the same in both windings, and the desired signal is of the opposite polarity in both windings, there is a cancellation of errors.

The output triangle wave produced by a triangle wave generator 24 of a type commonly used in circuits of this type, include substantial dc offsets. (the watt-watthour circuit described in U.S. Pat. No. 4,055,804 describes such a triangle wave generator). Triangle wave generator 24 is ac coupled so as to only use a single reference, which ac coupling requires a resistor and a capacitor. To enable utilization of a reasonably priced capacitor, the resistor value is normally made quite high, but a high resistor value is not compatible with the bias currents of accurate or high-speed comparators, and the result is substantial dc offsets. If only a single comparator is utilized, the dc offsets results in an offset on the pulse width modulator wave form. This offset is multiplied by the dc error of the current input, resulting in a dc product which is a zero error.

In the circuit of this invention, however, the dc offset of triangle wave generator 24 is common to both comparators and, therefore, results in no net dc in the output. The only dc errors that result are the dc errors resulting from offset of comparators 20 and 22, both of which are driven from low impedance sources. This permits the limits of performance of the comparators used to be attained and not degraded by source impedance. Furthermore, comparators 20 and 22 are common on a common substrate and therefore will exhibit similar offset voltages with a degree of confidence. With the reversal of the connections of the comparators, these similar offset voltages can be expected to achieve a degree of cancellation of their offset voltages and the resultant error on the output of the watt transducer or watthour meter.

Figure 4:
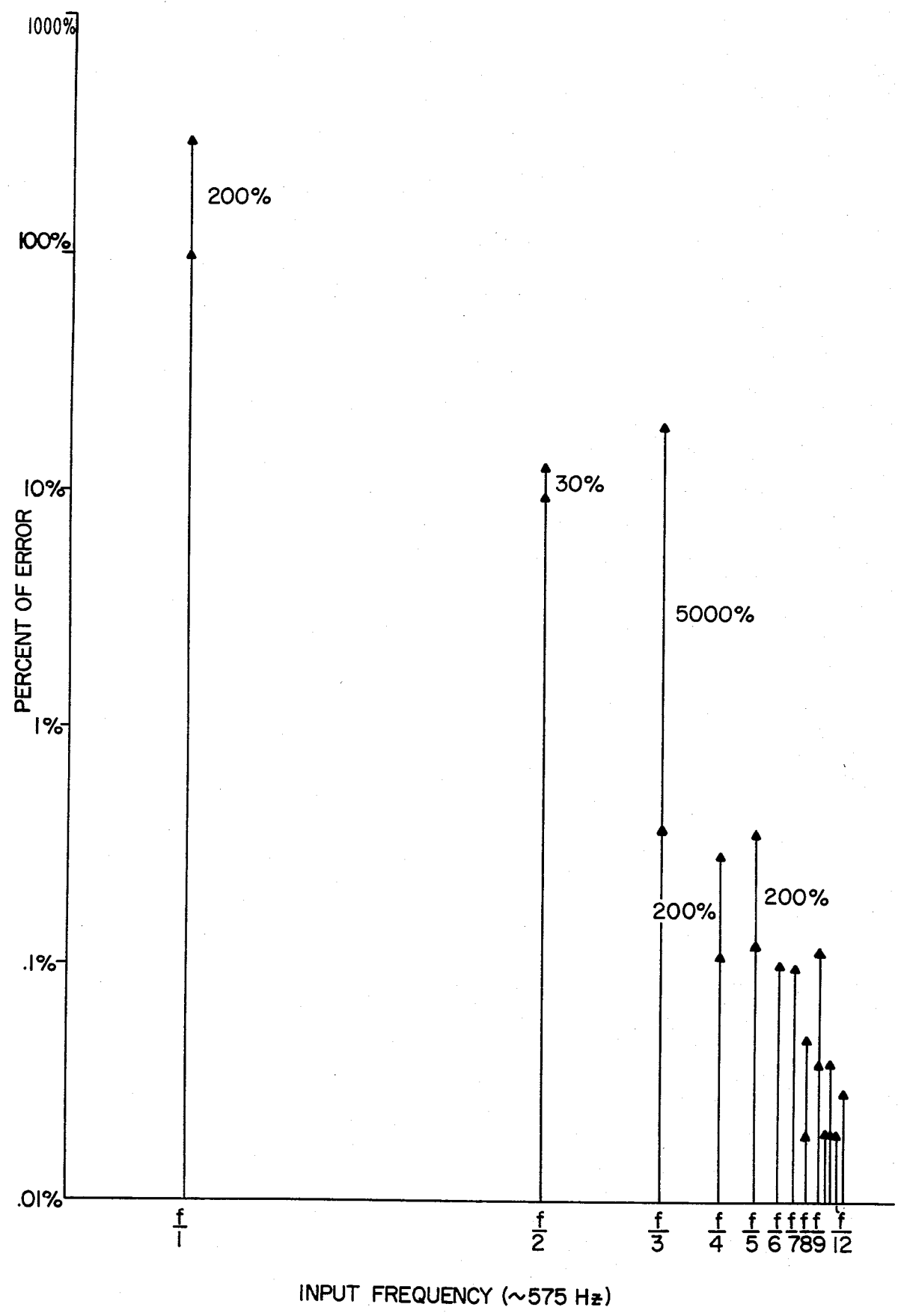
FIG. 4 is a graphical presentation illustrating input frequency vs output error for a watt transducer.

FIG. 4 illustrates typical beat frequency errors resulting when the frequency being measured is an integral fraction of the chopping frequency. F in FIG. 4 is the chopping frequency and the frequency being measured is the variable on the horizontal axis. The vertical axis is a logarithmic presentation of percent of error. These numbers are peak number for the error (which be of either polarity) and will average out in time if there is any difference at all between the frequency being measured and an integral fraction of the chopping frequency. Since the chopping frequency is not perfectly stable, and since the incoming frequency likewise cannot be perfectly stable, all these errors will average out to zero over a long period of time, such as in watthour applications. The errors represented here are short-term peak errors that can happen in periods of hundreds of milliseconds.

As shown in FIG. 4, if the incoming frequency is exactly equal to the chopping frequency F, a 200% higher error results from a full-wave multiplier versus the dual multiplier. At F/2, the error of the conventional multiplier is 30% higher. At F/3, it is 5000% higher. At F/4 and F/5 it is 200% higher, and at the frequencies in the region where actual use is made of the circuit, such as in a range of F/9 to F/16 the errors typically are 200% higher on the conventional multiplier as opposed to the improved dual multiplier circuit. This substantially is an improvement in the area of use effectively of 3:1.

As a result of the reduced errors at peak frequencies, it is possible to reduce the actual chopping frequency utilized in this invention substantially from many of the circuits of this type on the market today (chopping frequencies range from 600 to 50,000 Hertz on commercially available watt and watthour multipliers). The chopping frequency used in this invention is between 200 and 600 Hertz. This substantially lower chopping frequency is made possible by having the power line frequencies and their harmonics fall at points other than integral fractions of the chopping frequencies. If the chopping frequency is low enough, the components used (resistor and capacitor values) to implement the triangle wave generator can be stable enough so that, over temperature and production tolerances, the chopping frequency and its integral fractions do not fall upon the frequency to be measured or the harmonics.

With this improvement, a chopping frequency between 550 and 600 Hz can deliver performance in excess of units with chopping frequencies of 5000 Hz. Yet, the errors associated with the transfer of a dc reference to an ac measurement calibration are linearly proportional to the frequency. Therefore, with a 10:1 reduction in frequency, there is a 10:1 reduction in errors. These errors are normally adjusted out with potentiometers, but with the circuit of this invention the need for calibration is eliminated (or at least substantially reduced). This permits implementation substantially (or totally) within integrated circuits where adjustments are unrealistically expensive.

FIG. 5 illustrates typical wave forms generated within the circuit as shown in FIG. 1. FIG. 5(A) shows the wave forms present at the inputs to the comparators 20 and 22. The sine wave 52 (shown by solid line) is on the dot side output of transformer 17 and at the positive input of comparator 20. The inversion of the sine wave, (shown as a dotted line 54) is at the non-dot output side of transformer 17 and at the negative input of comparator 22. The triangle wave output 56 from triangle wave generator 24 (presented to both comparators) is illustrated superimposed.

Figure 5A:
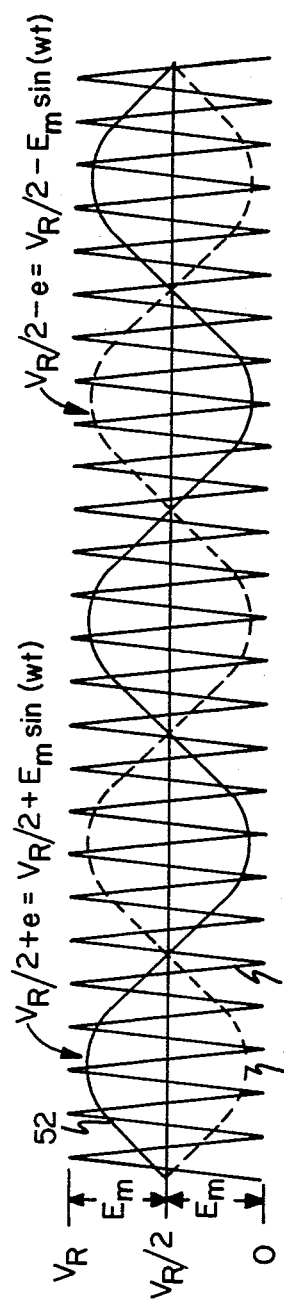
FIGS. 5(A), 5(B), 5(C) and 5(D) are a series of typical wave forms illustrating the invention as shown in FIG. 1.
Figure 5B:
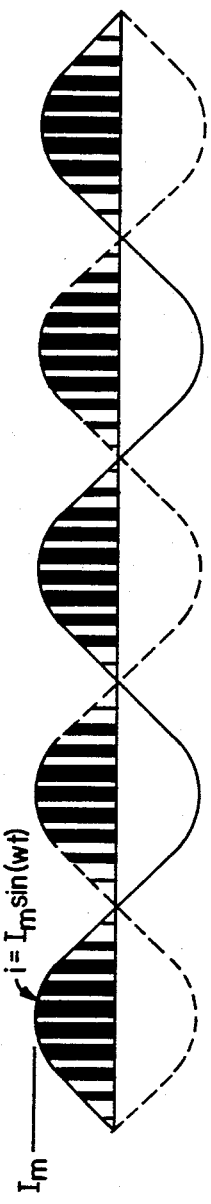

The comparator output drives switches 26 and 28 such that output is presented whenever the triangle wave form is between the two sine waves. The resultant outputs are shown in FIG. 5(B) as dark bars for a current that is in phase. The average value for these dark bars is 2F sine wave (120 Hz at power frequencies) typical of multiplying two sine waves.

Figure 5C:
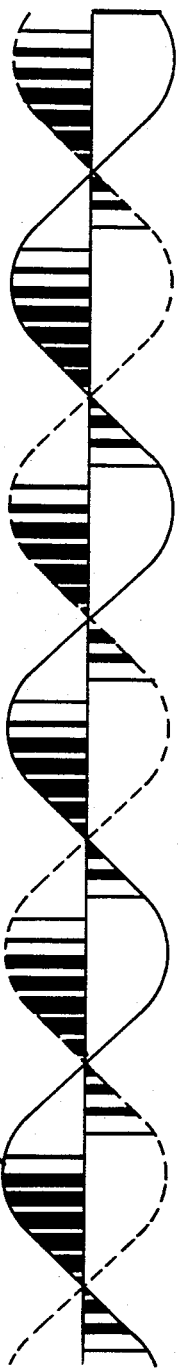
Figure 5D:
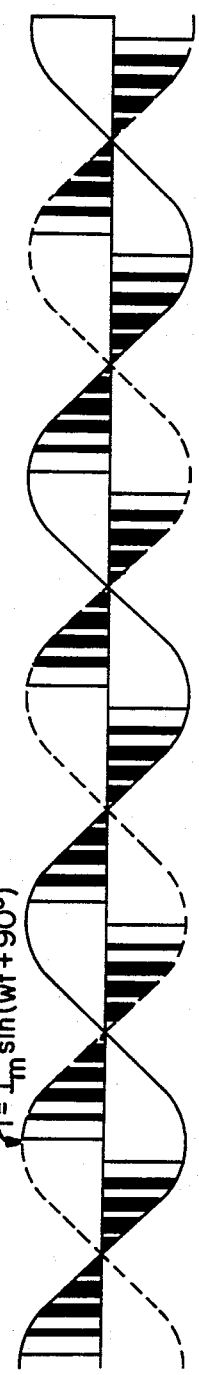

It should be noted that the chopping frequency ripple is at twice the frequency of the triangle wave generator. This is twice as high as it is in a conventional circuit. It should also be noted that the amplitude of the chopped wave forms is only half the height of the sine wave. This is half of the amplitude of the chopped pulses present in a conventional circuit. This results in a wave form coming out of the multiplexer that is four times easier to filter. For clarification, in FIG. 5(B), the height of the dark bars representing the value to be averaged is directly proportional to the current input, and the width of the dark bars is directly proportional to the amplitude of the voltage. Therefore, the average value of the dark bars is proportional to true watts. FIG. 5(C) shows the same wave form for a current $I_N$ 60 degrees lagging the input voltage form and FIG. 5 (D) shows the wave form 90 degrees lagging the input wave form.

Figure 6A:
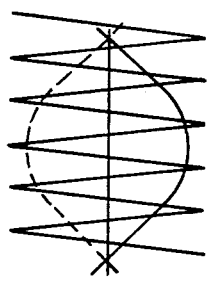
FIGS. 6(A) and 6(B) are typical wave forms illustrating operation of a prior art transducer.
Figure 6B:
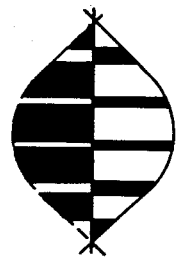

FIGS. 6(A) and 6(B) show wave forms typical of a circuit such as that described in U.S. Pat. No. 4,055,804, for example. FIG. 6(A) shows the single sine wave waveform compared and presented to a single comparator, along with the triangle wave form. FIG. 6(B) shows the resultant output from the multiplexers which may be a single multiplexer, a halfwave configuration with capacitor injections to cause full wave ripples, or a full wave multiplexer. To achieve an output such as FIG. 6(B), refer to multiplexer 26 (as shown in FIG. 1), which multiplexer would be driven by comparator 20, and multiplexer 28 would be driven by the inverse of comparator 20. Note that a substantial amount of current flows through the multiplexer at all times. Since the multiplexer is always conducting current and is always causing this current to be in slight error with regard to what is desired, there is error being presented to the output circuit at all times by the inaccuracies of the multiplexers. In comparing this to the circuit of FIG. 5(B), it can be seen that there is no current flowing out of the multiplexer into the output circuit during much of this time, and during this time, the multiplexers do not contribute whatsoever to the error of the unit. This improvement becomes substantially greater with lower voltage inputs, therefore realizing a unit which has a percent of reading capability on both the voltage and current axis, as opposed to a unit that has only percent of reading capability on the current input axis (as is now the case).

Triangle wave generator 24 may be conventional, but a prefered generator suitable for use in this invention is shown in FIGS. 7 and 9. The improved triangle wave generator 24 of this invention permits the generator to more closely achieve the exact amplitude of the reference voltage utilized by the generator. Since triangle wave generator 24 is the ac reference in this and similar circuits, an improvement in the generator directly improves and affects the accuracy of the entire circuit. By compensating for delays within the comparator of the generator, a high degree of cancellation of delay errors is achieved, which results in the usability of lower power consumption comparators and less expensive comparators, with high accuracy and stability of the resulting triangle wave form still being achieved.

As shown in FIG. 7, triangle wave generator 24 operates between a positive voltage reference and ground (rather than between a positive and a negative voltage reference which is more expensive). Operational amplifier 60 has an integrating capacitor 62 of very high quality connected between its negative input and output so that the amplifier and capacitor comprise an integrator. The output of this integrator is coupled to the negative input of operational amplifier 64 for a source to close the loop and integrate in both slopes.

At the beginning of the wave form illustrated, the integrator is integrating upwards and the positive input of comparator 64 is at plus voltage reference. When the negative input and the integrator output reach the voltage reference value, the output of comparator 64 switches to negative causing CMOS inverter 66 to switch positive which changes its output to a plus voltage reference and this causes a current to flow through resistor 68 causing the integrator to reverse and integrate in the opposite direction (downward).

The output of inverter 66 is coupled to the input of inverter 70 so, at this point in time, inverter 70 is switched negative and is now at ground so that the positive input of comparator 64 is at ground and awaiting the arrival of the integrator output to the ground level at which point it will switch again. In this fashion, triangle wave generator 24 switches continuously between voltage reference and ground. The CMOS inverter 66 acts like and is, in fact, a CMOS switch, or multiplexer, which accurately can switch to either the voltage reference or ground. It is necessary not to use these inverters for any other purpose so that the voltage reference can be accurately tracked and so that ground can be accurately tracked for referencing purposes.

To eliminate the errors caused by the delay of comparator 64, series connected comparator 72, switch 74 and resistors 76 and 78 have been incorporated. As shown in FIG. 7, the negative input of comparator 72 is connected with the output of converter 66 while resistor 76 is connected between the output of switch 74 and the negative input of operational amplifier 60, and resistor 78 is connected in parallel with resistor 68.

When a change in direction comes about when comparator 64 switches, the integrater reverses direction. At the same time, the input to comparator 72 is reversed by being driven from the output of converter 66. A period of time later (with a time delay), comparator 72 also switches driving switch 74 and causing a current to be injected into the integrater through resistor 76, thereby affecting and controlling the slope of the integrater. Under normal integration, instead of integrating with a single component of resistance for a single unit of resistance ($V_r/47K$), the integrater is integrating with two units of current being injected in one direction through resistors 68 and 78, and with one unit of current being removed through resistor 76. If comparator 72, switch 74, and resistors 76 and 78 are not utilized, only a single unit of current causes integration during normal operation.

The single current of integration is capable of changto three units of integrating current during the time period during which comparator 72 has had its input switched but is under delay and has not switched at its output. During this time period, the inputs to resistors 68, 76 and 78 are all of the same polarity and the slope of the integrater at its output is three times as great as normal.

Figure 8:
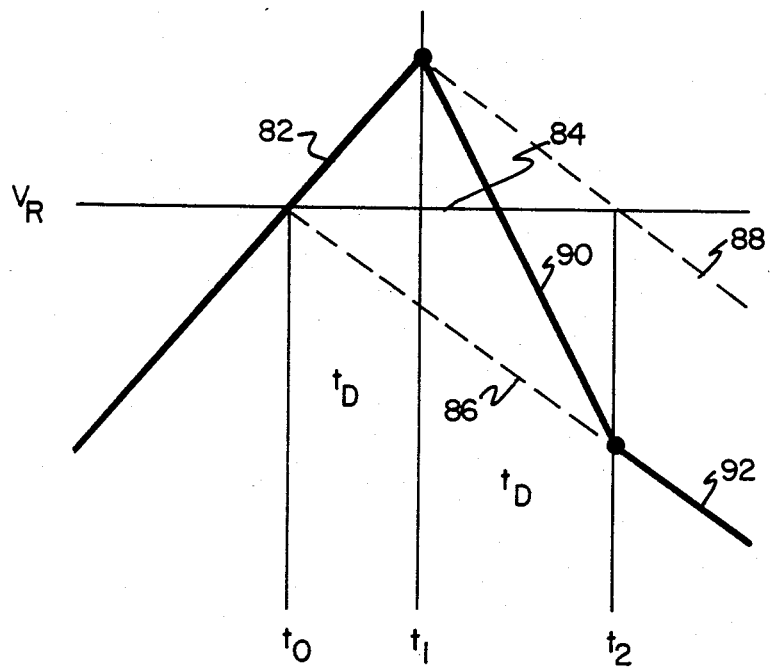
FIGS. 8(A) and 8(B) are typical wave forms of the triangle wave generator shown in FIG. 7.

The diagram shown in FIG. 8 explains and clarifies the advantage of the proper use of this relationship in the circuit. Line 82 represents the normal approach of the integrater output towards the voltage reference potential represented as line 84. When lines 82 and 84 cross each other, if there were no delay within comparator 64, the units would integrate down line 86, the desired line for exact calibration of the resultant triangle wave. Instead, line 82 overshoots until it reaches time $T_1$ because of the time delay of comparator 64. When it switches at time $T_1$, it would follow line 88 down except, because of the addition of comparator 72, switch 74 and resistors 76 and 78, it now has three units of current and follows line 90. It follows line 90 for the period of time it takes comparator 72 to switch (i.e., until it reaches time $T_2$). At time $T_2$, it will follow line 92 which is, in this example, coincident with line 86, the desired line.

What this means, is that far away from ground and voltage reference, in the area in which the wave form of the triangle wave generator is actually being used for comparison with another waveform (such as occurs in the pulse width modulation multiplier), the calibration of the triangle wave generator is very close to the ideal calibration and has a significant cancellation of errors dependent upon the similarity of time delays of comparators 64 and 72. The slope ideally is 3 to 1 to achieve this cancellation.

For practical purposes, comparators 64 and 72 should be exactly the same type, and furthermore should be manufactured at the same time with the same process, on the same piece of silicon. When this condition exists, the error cancellation effect is enhanced. A degradation in the error cancellation is present because of the fact that comparators 64 and 72 are not operating under identical conditions. Comparator 64 is sensing a ramp that, in comparison to its own speed, slowly approaches zero volts and crosses over zero volts so that within a microsecond of when it switches, it is within a few millivolts of zero volt potential, permitting its input stage to come out of saturation and thereby speeding the device up when it finally shifts. A negative factor as far as the speed of comparator 64 is concerned, is that when it does switch, the overdrive available to it (the signal crossover in excess of which is necessary to cause it to switch) is small for the first microsecond or two, causing the internal current available to cause is to switch to be low, causing its speed to be slowed down.

Comparator 72, on the other hand, has its input stage thoroughly in saturation because it has $V_r/2$ volts across its two input leads at all times. When it is brought out of saturation, its overdrive is very large. The input saturation delay does not exactly equal the overdrive speed enhancement property, and as a result, comparator 72 may switch slower than comparator 64. In actuality, with common comparators, this is usually the case. However, the degree of cancellation is substantial, because much of the delay is in the intermediary and output stages, which are under very similar conditions in the two comparators.

FIG. 9 is an expanded schematic of the generator as FIG. 7. As shown, operational amplifier 60 is an LM301 operational amplifier. It is compensated in the feed forward mode for extreme speed for eliminating the error of the speed limitation of this device. The crucial integrating capacitor 62 is a 0.011 MFD polystyrene capacitor, with a 1% tolerance and a maximum dissipation factor of 0.00006. Resistors 68, 76 and 78 are 47K ohms plus or minus 1%. They are thick film resistors made simultaneously on a single substrate in a single inline package. Resistor 94 is for the purpose of maintaining constant current being drawn from the voltage reference, both during positive integration and during negative integration. This means that the finite output impedance of the voltage reference does not weigh into the performance of the circuit because there are current difference current draws out of it at different points in its operation. Comparators 64 and 72 are a dual comparator LM319. This comparator exhibits a good compromise of high speed and low currents draw in the available dual comparators, and relatively little of its delay presents itself in the input circuits, resulting in excellent cancellation of errors in the preferred circuit shown. Inverters 66, 70 and 74 are of the polysquared CMOS type similar in performance to ISO CMOS that exhibits very low time delay. The low time delays mean that the majority of the delay in the circuit is within the comparators where there is a high degree of cancellation. The observed delays are on the order of 7 nanoseconds per inverter.

Inverters 96, 98 and 100 parallel inverter 66 because in this dual comparator error cancellation circuit, with four times lower output impedance on the output of inverter 66 than on the output of inverter 74, the output impedance of the CMOS inverters cancels as it influences the frequency of the triangle wave generator. This means that if there is a fair amount of impedance equality among the CMOS inverters (which there always is in integrated designs), then the frequency of oscillation is determined by the R resistance of resistors 68, 76 and 78 and the capacitance of inverter 62, and is not determined by any other component.

Capacitor 102 bypasses the LM301 operational amplifier 60 so that the large spikes of current caused when this inverts do not enter other circuitry. Capacitor 102 is a 0.01 MFD monolithic capacitor. Capacitor 104 is a 150 picofarad monolithic ceramic capacitor which is the feed forward compensating capacitor of op amp 60. Capacitor 104 is part of the compensating circuit in conjunction with capacitor 62 which is also part of the compensating circuit as well as the integrating capacitor. There has been no measurable degradation in performance by utilizing capacitor 62 for both functions. The more conventional circuit of having another capacitor decouple from the output pin into the inverting input pin does exhibit degradation in the form of nonlinearity at the turn around point and near the turn around point.

Resistors 106, 108, 110 and 112 are for the purpose of dividing down the output of the dual comparator LM319 to the voltage reference level. Within the circuit in which this preferred embodiment has been presently used, the power supply voltages are twice the reference voltages. Therefore, two equal resistors in series connected to the outputs of the open collectors of the comparators 64 and 72 causes a 2 to 1 division in the level of the output to match the power supply of the CMOS inverters 66, 70, 74, 96, 98 and 100 which are powered by voltage reference.

Capacitor 114 which is connected in positive feedback mode to comparator 64 speeds up the switching speed of the output of comparator 64. This speed-up causes a high degree of similarity in speed between comparators 64 and 72 in this preferred embodiment which resulted in the high degree of error cancellation.

While a conventional filter and/or a filter such as shown in U.S. Pat. No. 4,055,804 might be utilized in this invention, a preferred filter circuit is shown in FIGS. 10 through 12.

Filters for removing a frequency equal to twice the fundamental of the measured frequency and for removing chopping frequency within watt transducers and other types of transducers have traditionally been of passive design. A typical design is described, for example, in U.S. Pat. No. 4,027,241 wherein a current input - current output three - stage passive filter achieves the necessary filtering. A two - pole lower cost higher performance active filter accomplishing the same purpose, is described, for example, in U.S. Pat. No. 4,055,804. This active filter made it possible to use smaller and less expensive components and to use only two - poles of components to achieve the desired degree of filtering, and is now more widely used.

Figure 10:
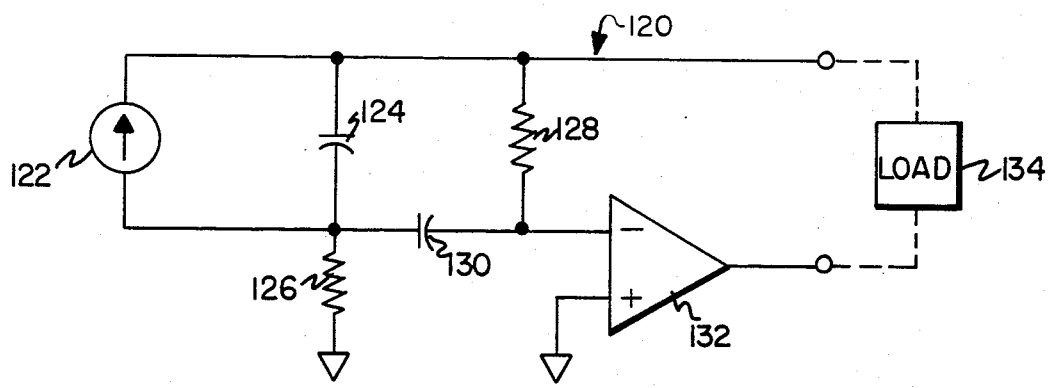
FIG. 10 is a schematic diagram of a two-pole filter utilizable in this invention.
Figure 11:
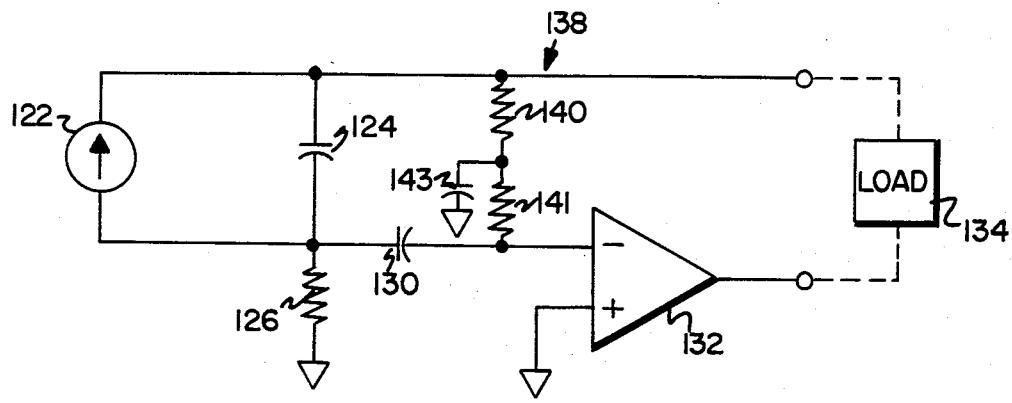
FIG. 11 is a schematic diagram of a three-pole filter utilizable in this invention.
Figure 12:
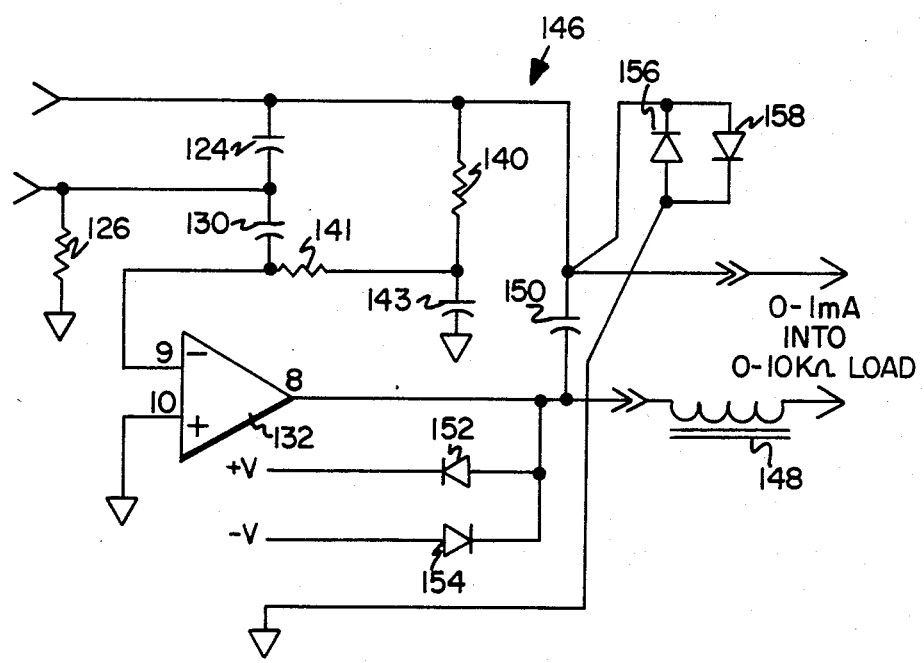
FIG. 12 is an expanded schematic diagram of a preferred three-pole filter utilizable in this invention.

Improved active filter circuits are shown in FIGS. 10 through 12, which filters are suitable for filtering current outputs to external loads for application such as power metering transducers, and specifically watt and watt - hour transducers as well VAR hour transducers. As shown in FIG. 10, two - pole filter circuit 120 illustrates a typical example of the invention. A current source 122 is connected across a filtering capacitor 124 (which could comprise more than one capacitor when needed or desired), which in conjunction with resistor 126 forms one - pole of the filter. If this were a single - pole design, resistor 128 would be a short circuit. A second pole is added, however, to comprising resistor 128 and capacitor 130 connected to the high impedance input of operational amplifier 132. Only the first pole of the two-pole filter needs to be low in impedance and therefore will have expensive capacitors. While the current source must be floating with respect to ground, this is already a requirement with watt/watthour applications. A second output from the filter may be obtained on the ground side of resistor 126 if such an output is desired or required for a watthour integrater. Operational amplifer 132 unburdens the filter so that the load burden 134, whatever its value, will not influence the filtering response of the device. This achieves a necessary degree of flexibility and usage of the resultant circuit. There is normally a significant amount of transient protection components attached on and around the amplifier for the purposes of protecting it from surges and transients in typical utility application.

As shown in FIGS. 10 through 12, the positive input of operational amplifier 132 is connected with ground. This makes it possible to provide a three - pole active filter, as shown in FIGS. 11 and 12, and also makes it possible to produce circuits wherein all amplifiers are ground referenced, for ease in integration and can make one less point within the integrated circuit where protection from transients at the output must be considered.

A three-pole version 138 of the filtering circuit is shown in FIG. 11 to be substantially the same as shown and described with respect to FIG. 10, except that resistor 128 is tapped to form resistors 140 and 141 with the tap being connected through capacitor 143 to ground, forming the third pole of the filter. This easy connection of the third pole is obtainable because of the ground referenced operational amplifier.

FIG. 12 shows the preferred embodiment 146 for the filter circuit. The output from solid-state switches 26 and 28 (FIG. 1), which outputs are pulse width modulated signals, are combined and coupled across 330 MFD capacitor 124 which is the only low impedance, high cost capacitor in the circuit. Capacitor 124 works in conjunction with a 150 ohms resistor 126 to form the first pole of the three-pole filter. The second pole consists of 0.1 MFD capacitor 130 and a 100K ohms resistor 141, while the third pole consists of 0.1 MFD capacitor 143 and a 100K ohms resistor 140. The output amplifier 132 is connected as shown to the output terminal and to the filter circuit, and is a LF347. The remaining components shown are protective components. Inductor 148 is 6.8 microhenrys, and is wound so that it is not readily saturated and so that it can absorb transients in excess of 5000 volts. Capacitor 150 is 0.1 MFD film capacitor which inductor 148 works into to drop the voltage. Diodes 152, 154, 156 and 158 are diodes which will carry transients if they get close to the limits of the power supply upon which operational amplifier 132 is working, and all are IN458A. Operational amplifier 132 is a fet input integrated operational amplifier of a type very common today.

While two and three-pole filters have been described herein, the filtering circuit could be expanded to four or more poles. The additional poles would be operating (see FIG. 10 for example) between the junction of capacitor 124 and resistor 126, and the other side of capacitor 124 and the negative input to amplifier 132. To gain satisfactory performance, once the three-poles have been exceeded, additional amplifiers may be needed.

The circuit described with respect to FIG. 12 was optimized experimentally for optimum filtering at the fastest settling time for the particular characteristics of the wave form coming out of the modulator such as shown in FIG. 1. This circuit is capable of being optimized and detailed, however, to form any kind of active filter, such as Butterworth, eliptical, or others, and is capable of being used for any type of current output filtering application, including watt or watt/hour transducers, Var transducers, Var hour transducers, frequency transducers, power factor transducers, current transducers, voltage transducers, and other types of transducers beyond those found in the utility field.

As can be appreciated from the foregoing, this invention provides an improved power transducer having a dual multiplier circuit and an improved triangle wave generator and filter circuit.

What is claimed is:

1. A power transducer, comprising:
   input means adapted to receive a current input and a voltage input from a power source to be monitored and providing separate outputs one of which is proportional to the instantaneous current of said power source and the other of which is proportional to the instantaneous voltage of said power source;
   dual multiplier means having a first portion connected with said input means to receive one of said outputs therefrom, and a second portion connected with said input means to receive the other of said outputs therefrom and responsive thereto providing dual control outputs to said first portion so that said first portion, provides dual pulse width modulated output signals indicative of the instantaneous current and voltage of said monitored power source; and
   output means connected with said dual multiplier means to receive said pulse width modulated output signals therefrom and responsive thereto providing an output accurately indicative of the instantaneous power of said monitored power source.

2. The power transducer of claim 1 wherein said input means includes first and second transformers one of which provides dual outputs of opposite polarity, which outputs are isolated and scaled replicas of the voltage at a monitored power source, and the other of which transformers provide an isolated and scaled replica of the current of said monitored power source.

3. The power transducer of claim 1 wherein said first portion of said dual multiplier means includes a pair of multiplexers, and wherein said second portion of said dual multiplier means includes means for separately controlling each of said multiplexers.

4. The power transducer of claim 1 wherein said dual multiplier means includes signal generating means, and wherein said second portion of said dual multiplier means includes a pair of comparators receiving said one input from said input means and the output from said signal generating means to provide said dual control outputs.

5. The power transducer of claim 4 wherein said signal generating means is a triangle wave generator having a relatively low frequency.

6. The power transducer of claim 1 wherein said output means includes a filter for receiving the combined outputs from said first portion of said dual multiplier means.

7. A power transducer, comprising:
   voltage input means adapted to be connected to a power source to be monitored, said voltage input means providing dual outputs proportional to the voltage sensed at said power source;
   current input means adapted to be connected to said power source to be monitored, said current input means providing an output proportional to the current sensed at said power source;
   dual multiplier means having first and second means for separately receiving said dual outputs from said voltage input means and responsive thereto providing first and second control signals indicative of said voltage sensed at said voltage means, and third and fourth means for receiving said control signals from said first and second means and said output from said current input means and responsive thereto providing outputs indicative of the voltage and current sensed at said monitored power source; and
   output means for receiving said output from said third and fourth means and providing an output signal indicative of the power sensed at said power source.

8. The transducer of claim 7 wherein said voltage input means is a transformer having a first and second secondary windings, and wherein said dual outputs are coupled from said secondary windings.

9. The transducer of claim 7 wherein said dual outputs provided from said voltage input means are of opposite polarity relative to one another.

10. The transducer of claim 7 wherein said first and second means of said dual multiplier means are comparators, wherein said dual multiplier means includes triangle wave generating means for providing a triangular wave form to said comparators with a frequency of said triangular wave form being less than about 600 Hz.

11. The transducer of claim 7 wherein said third and fourth means of said dual multiplier means are multiplexers.

12. The transducer of claim 11 wherein said first and second means of said dual multiplier means are comparators providing dual multiplexed outputs, which outputs are coupled to said third and fourth means.

13. The transducer of claim 12 wherein said comparators provide pulse width modulated outputs as said control signals which are coupled to said multiplexers for causing said multiplexers to provide said outputs indicative of the voltage and current sensed at said monitored power source.

14. The transducer of claim 7 wherein said output means includes an active filter.

15. A power transducer, comprising:
a first transformer adapted to received a voltage input from a power source to be monitored, said first transformer having a pair of secondary windings each of which provide an output opposite in polarity with respect to the other with both providing an isolated and scaled replica of said voltage input;
a triangle wave generator providing a triangle wave form output;
first and second comparators each of which is connected with said triangle wave generator to receive said triangle wave output therefrom and with a different one of said secondary windings to receive said outputs therefrom, each of said comparators providing a half-wave pulse modulated control output signal proportional to the voltage sensed at said power source;
a second transformer adapted to receive a current input from said power source to be monitored, said second transformer providing an isolated and scaled replica of said current input;
first and second switches connected with said second transformer to receive said output therefrom, and with different ones of said first and second comparators to receive said control output signals therefrom for controlling said switches whereby said switches provide pulse outputs having a height proportional to the voltage sensed at said power source and a width proportional to the current sensed at said power source; and
active filter means for receiving said pulse outputs from said first and second switches and providing an output indicative of the power sensed at said monitored power source.

16. The transducer of claim 15 wherein said power source is a power line, wherein said first and second transformers sense the instantaneous power on said power line, and wherein said active filter means provides an output indicative of the power flowing through said power line.

17. The transducer of claim 15 wherein said transducer is one of a watt, Q and Var transducer.

18. The transducer of claim 15 wherein said transducer is a watt transducer.

* * * * *